US008314423B2

(12) United States Patent
Chen et al.

(10) Patent No.: US 8,314,423 B2
(45) Date of Patent: Nov. 20, 2012

(54) THIN FILM TRANSISTOR ARRAY SUBSTRATE AND MANUFACTURING METHOD THEREOF

(75) Inventors: Chien-Hung Chen, Taipei (TW);
Lih-Hsiung Chan, Kaohsiung (TW);
Chin-Yueh Liao, Taipei (TW);
Hsien-Kai Tseng, Taoyuan County (TW)

(73) Assignee: Au Optronics Corporation, Hsinchu (TW)

( * ) Notice: Subject to any disclaimer, the term of this patent is extended or adjusted under 35 U.S.C. 154(b) by 487 days.

(21) Appl. No.: 12/560,428

(22) Filed: Sep. 16, 2009

(65) Prior Publication Data

US 2010/0320466 A1    Dec. 23, 2010

(30) Foreign Application Priority Data

Jun. 17, 2009    (TW) ................. 98120246 A

(51) Int. Cl.
*H01L 29/786*    (2006.01)
(52) U.S. Cl. .................... 257/59; 257/72; 257/E51.005; 438/149
(58) Field of Classification Search ........... 257/59, 257/72, E51.005; 438/149
See application file for complete search history.

(56) References Cited

U.S. PATENT DOCUMENTS

| 6,038,003 A * | 3/2000 | Kim ................................ 349/43 |
| 6,166,794 A | 12/2000 | Sung | |
| 6,395,586 B1 * | 5/2002 | Huang et al. .................. 438/149 |
| 7,019,807 B2 | 3/2006 | Yamasaki | |
| 2004/0105042 A1 | 6/2004 | Huang et al. | |
| 2004/0141128 A1 | 7/2004 | Kim et al. | |
| 2005/0045885 A1 | 3/2005 | Kim et al. | |

FOREIGN PATENT DOCUMENTS

CN    101299411    11/2008

OTHER PUBLICATIONS

"Office Action of China Counterpart Application", issued on Aug. 4, 2010, p. 1-p. 5.

* cited by examiner

*Primary Examiner* — Kenneth Parker
*Assistant Examiner* — John Lin
(74) *Attorney, Agent, or Firm* — Jianq Chyun IP Office

(57) ABSTRACT

A thin film transistor array substrate and a manufacturing method thereof are provided. In the manufacturing method, a first patterned conductive layer including a plurality of scan lines and a plurality of gates connected with the scan lines is formed on a substrate. A patterned gate insulating layer having a plurality of openings is then formed on the substrate to cover at least a portion of the first patterned conductive layer, and a plurality of dielectric patterns are formed in the openings. A plurality of semiconductor patterns are formed on the patterned gate insulating layer. A second patterned conductive layer is formed on the semiconductor patterns, the patterned gate insulating layer, and the dielectric patterns. A passivation layer is formed on the semiconductor patterns, the patterned gate insulating layer, and the dielectric patterns. A plurality of pixel electrodes are formed on the passivation layer.

27 Claims, 16 Drawing Sheets

THIN FILM TRANSISTOR ARRAY SUBSTRATE AND MANUFACTURING METHOD THEREOF

CROSS-REFERENCE TO RELATED APPLICATION

This application claims the priority benefit of Taiwan application serial no. 98120246, filed on Jun. 17, 2009. The entirety of the above-mentioned patent application is hereby incorporated by reference herein and made a part of specification.

BACKGROUND OF THE INVENTION

1. Field of the Invention

The present application is related to a thin film transistor (TFT) array substrate and a manufacturing method of the TFT array substrate. More particularly, the present application is related to a TFT array substrate capable of resolving an issue of RC delay and a manufacturing method of the TFT array substrate.

2. Description of Related Art

With increasing progress towards display technologies, displays facilitate our daily lives, and the demands for light and compact displays contribute to development of flat panel displays (FPDs) as mainstream displays. Among various FPDs, liquid crystal displays (LCD) characterized by great space utilization, low power consumption, non-radiation, and low electromagnetic interference have become prevailing.

An LCD is mainly composed of an active array substrate, a color filter substrate, and a liquid crystal layer sandwiched between the two substrates. The active array substrate has a pixel structure thereon, a plurality of data lines electrically connected with the pixel structure, a common line, and so forth. Since the data lines, the scan lines, and the common lines are mostly made of metal, and each layer of metal is separated by an insulating layer, parasitic capacitance is frequently generated, which results in RC delay.

Additionally, in a normal active array, a gate insulating layer in different regions has the same dielectric constant. To stabilize device properties of a TFT, the gate insulating layer in the TFT is required to have a high dielectric constant. Nonetheless, in a storage capacitor, large storage capacitance can be generated if the gate insulating layer is made of materials with high dielectric constants.

SUMMARY OF THE INVENTION

The present application is directed to a TFT array substrate capable of remedying an RC delay defect.

The present application is further directed to a manufacturing method of a TFT array substrate capable of reducing costs.

The present application is further directed to a manufacturing method of a TFT array substrate capable of reducing the number of required photomasks.

In the present application, a TFT array substrate including a substrate, a first patterned conductive layer, a patterned gate insulating layer, a plurality of dielectric patterns, a plurality of semiconductor patterns, a second patterned conductive layer, a passivation layer, and a plurality of pixel electrodes is provided. The first patterned conductive layer is disposed on the substrate. Besides, the first patterned conductive layer includes a plurality of scan lines and a plurality of gates connected with the scan lines. The patterned gate insulating layer is disposed on the substrate to cover the first patterned conductive layer. Here, the patterned gate insulating layer has a plurality of openings. The dielectric patterns are located in the openings. A dielectric constant of the dielectric patterns is smaller than a dielectric constant of the patterned gate insulating layer. The semiconductor patterns are disposed on the patterned gate insulating layer. Here, the semiconductor patterns include a plurality of channel layers separated from one another. The second patterned conductive layer is disposed on the semiconductor patterns, the patterned gate insulating layer, and the dielectric patterns. Here, the second patterned conductive layer includes a plurality of data lines, a plurality of sources connected with the data lines, and a plurality of drains. The passivation layer is disposed on the semiconductor patterns, the patterned gate insulating layer, and the dielectric patterns to cover the second patterned conductive layer. The pixel electrodes are disposed on the passivation layer. Each of the pixel electrodes is electrically connected with corresponding one of the drains, respectively.

According to an exemplary embodiment of the present invention, the dielectric patterns correspond to intersections between the scan lines and the data lines, for example.

According to an exemplary embodiment of the present invention, the dielectric constant of the patterned gate insulating layer, for example, ranges from 5 to 9, and the dielectric constant of the dielectric patterns, for example, ranges from 2 to 4.

According to an exemplary embodiment of the present invention, the dielectric patterns are, for example, located on the scan lines.

According to an exemplary embodiment of the present invention, the first patterned conductive layer further includes a common line. A portion of the common line is covered by the dielectric patterns, and the dielectric patterns are located between a portion of the common line and a portion of the data lines.

According to an exemplary embodiment of the present invention, a material of the dielectric patterns is, for example, polymethylmethacrylate (PMMA), hydrogen silsesquioxane (HSQ), organic Silsesquioxane (OSQ), polyimide (PI), poly (ethylene 2,6-napthalate) (PEN), polyethyleneterephthalate (PET), tri-phenylsulfonium hexafluoroantimonate salt (TSFA), dimethyl methylphosphonate (DMMP), or a combination thereof.

In the present application, a manufacturing method of a TFT array substrate is further provided. In the manufacturing method, first, a first patterned conductive layer is formed on a substrate. The first patterned conductive layer includes a plurality of scan lines and a plurality of gates connected with the scan lines. A patterned gate insulating layer having a plurality of openings is then formed on the substrate to cover the first patterned conductive layer, and a plurality of dielectric patterns are formed in the openings. Here, a dielectric constant of the dielectric patterns is smaller than a dielectric constant of the patterned gate insulating layer. Next, a plurality of semiconductor patterns are formed on at least a portion of the patterned gate insulating layer, e.g. gates. Thereafter, a second patterned conductive layer is formed on the semiconductor patterns, the patterned gate insulating layer, and the dielectric patterns. Here, the second patterned conductive layer includes a plurality of data lines, a plurality of sources connected with the data lines, and a plurality of drains. A passivation layer is then formed on the semiconductor patterns, the patterned gate insulating layer, and the dielectric patterns to cover the second patterned conductive layer. After that, a plurality of pixel electrodes are formed on the passivation layer. Each of the pixel electrodes is electrically connected with corresponding one of the drains, respectively.

According to an exemplary embodiment of the present invention, a method of forming the patterned gate insulating layer, the semiconductor patterns, and the dielectric patterns includes a step of sequentially forming an insulating material layer and a semiconductor material layer on the substrate at first to cover the first patterned conductive layer. After that, a first patterned photoresist layer is formed on the semiconductor material layer. A portion of the semiconductor material layer and a portion of the insulating material layer are then removed by using the first patterned photoresist layer as a mask to form the patterned gate insulating layer having the openings. The dielectric patterns are then formed in the openings. Next, a second patterned photoresist layer is formed on the semiconductor material layer that is not removed. Afterward, another portion of the semiconductor material layer is removed by using the second patterned photoresist layer as a mask to form the semiconductor patterns.

According to an exemplary embodiment of the present invention, a method of forming the dielectric patterns includes performing an ink jet printing process, for example.

According to an exemplary embodiment of the present invention, a method of forming the dielectric patterns can further include performing a curing process after the ink jet printing process is performed.

According to an exemplary embodiment of the present invention, the dielectric patterns are formed before the semiconductor patterns are formed.

According to an exemplary embodiment of the present invention, the dielectric patterns are formed after the semiconductor patterns are formed.

According to an exemplary embodiment of the present invention, the steps of forming the patterned gate insulating layer, the semiconductor patterns, and the dielectric patterns include a step of sequentially forming an insulating material layer and a semiconductor material layer on the substrate at first to cover at least a portion of the first patterned conductive layer. Next, a half-tone patterned photoresist layer is formed on the semiconductor material layer. The half-tone patterned photoresist layer has a first portion and a second portion, and a thickness of the first portion is greater than a thickness of the second portion. A portion of the semiconductor material layer and a portion of the insulating material layer are then removed by using the half-tone patterned photoresist layer as a mask to form the patterned gate insulating layer having the openings. Next, the dielectric patterns are formed in the openings. Thereafter, a thickness of the half-tone patterned photoresist layer is reduced until the second portion of the half-tone patterned photoresist layer is removed, such that a second patterned photoresist layer is formed. Afterward, another portion of the semiconductor material layer is removed by using the second patterned photoresist layer as a mask, such that the semiconductor patterns are formed.

According to an exemplary embodiment of the present invention, the dielectric patterns are formed before the second patterned photoresist layer is formed.

In the present application, a manufacturing method of a TFT array substrate is further provided. In the manufacturing method, first, a first patterned conductive layer is formed on a substrate. The first patterned conductive layer includes a plurality of scan lines and a plurality of gates connected with the scan lines. An insulating material layer, a semiconductor material layer, and an ohmic contact material layer are sequentially formed on the substrate to cover the first patterned conductive layer. Next, a first half-tone patterned photoresist layer is formed on the substrate. The first half-tone patterned photoresist layer has a first portion and a second portion, and a thickness of the first portion is greater than a thickness of the second portion. Thereafter, a portion of the ohmic contact material layer, a portion of the semiconductor material layer, and a portion of the insulating material layer are removed by using the first half-tone patterned photoresist layer as a mask, such that a patterned ohmic contact material layer having a plurality of openings, a patterned semiconductor layer, and a patterned gate insulating layer are formed. A thickness of the first half-tone patterned photoresist layer is then reduced until the second portion of the first half-tone patterned photoresist layer is removed, such that a first patterned photoresist layer is formed. A plurality of dielectric patterns are then formed in the openings. Here, a dielectric constant of the dielectric patterns is smaller than a dielectric constant of the patterned gate insulating layer. Afterward, a second patterned conductive layer is formed on a region (of the patterned ohmic contact material layer 115b) exposed by the first patterned photoresist layer. The second patterned conductive layer includes a plurality of data lines, a plurality of sources connected with the data lines, and a plurality of drains. The first patterned photoresist layer is subsequently removed. Next, a portion of the patterned ohmic contact material layer is removed by using the second patterned conductive layer as a mask. After that, a passivation layer is formed on the patterned semiconductor layer and the second patterned conductive layer. Thereafter, a second half-tone patterned photoresist layer is formed on the substrate. The second half-tone patterned photoresist layer has a third portion and a fourth portion, and a thickness of the third portion is greater than a thickness of the fourth portion. A portion of the passivation layer, a portion of the patterned semiconductor layer, and a portion of the patterned gate insulating layer are then removed by using the second half-tone patterned photoresist layer as a mask. Thereafter, a thickness of the second half-tone patterned photoresist layer is reduced until the fourth portion of the second half-tone patterned photoresist layer is removed, such that a second patterned photoresist layer is formed. A plurality of pixel electrodes are formed on a region exposed by the second patterned photoresist layer, and each of the pixel electrodes is electrically connected with one of the drains, respectively. Thereafter, the second patterned photoresist layer is removed.

In the present application, a manufacturing method of a TFT array substrate is further provided. In the manufacturing method, first, a first patterned conductive layer is formed on a substrate. The first patterned conductive layer includes a plurality of scan lines, a plurality of gates connected with the scan lines, and a common line. An insulating material layer, a semiconductor material layer, and an ohmic contact material layer are sequentially formed on the substrate to cover the first patterned conductive layer. A first half-tone patterned photoresist layer is then formed on the substrate. The first half-tone patterned photoresist layer has a first portion and a second portion, and a thickness of the first portion is greater than a thickness of the second portion. Here, the first half-tone patterned photoresist layer partially exposes a region above the common line. Next, a portion of the ohmic contact material layer, a portion of the semiconductor material layer, and a portion of the insulating material layer are removed by using the first half-tone patterned photoresist layer as a mask, such that a patterned ohmic contact material layer having a plurality of first openings and a plurality of second openings, a patterned semiconductor layer, and a patterned gate insulating layer are formed. Here, the second openings expose a portion of the common line. A thickness of the first half-tone patterned photoresist layer is then reduced until the second portion of the first half-tone patterned photoresist layer is removed, such that a first patterned photoresist layer is formed. Thereafter, a plurality of dielectric patterns are formed in the first openings. Here, a dielectric constant of the dielectric patterns is smaller than a dielectric constant of the patterned gate insulating layer. Afterward, a second patterned conductive layer is formed on a region exposed by the first patterned photoresist layer. The second patterned conductive layer includes a plurality of data lines, a plurality of sources connected with the data lines, and a plurality of drains. The first patterned photoresist layer is subsequently removed. Next, a portion of the patterned ohmic contact material layer is removed by using the second patterned conductive layer as a mask. After that, a passivation layer is formed on the patterned semiconductor layer and the second patterned conductive layer. Thereafter, a second half-tone patterned photoresist layer is formed on the substrate. The second half-tone patterned photoresist layer has a third portion and a fourth portion, and a thickness of the third portion is greater than a thickness of the fourth portion. A portion of the passivation layer, a portion of the patterned semiconductor layer, and a portion of the patterned gate insulating layer are then removed by using the second half-tone patterned photoresist layer as a mask. Thereafter, a thickness of the second half-tone patterned photoresist layer is reduced until the fourth portion of the second half-tone patterned photoresist layer is removed, such that a second patterned photoresist layer is formed. A plurality of pixel electrodes are formed on a region exposed by the second patterned photoresist layer, and each of the pixel electrodes is electrically connected with one of the drains, respectively. Thereafter, the second patterned photoresist layer is removed.

Based on the above, the dielectric patterns having a low dielectric constant are disposed between a portion of the common line and a portion of the data lines, at intersections between the scan lines and the data lines, or on a portion of the scan lines. Thereby, parasitic capacitance is almost not generated in the aforesaid regions, such that the RC delay defect is remedied.

Besides, since the RC delay defect is remedied in the present application, a double-side driving circuit design is not required. Therefore, the number of driving devices can be reduced, and so can the manufacturing costs.

On the other hand, the gate insulating layer in different regions has different dielectric constants according to the present application. Thereby, design demands for stabilizing TFT device properties and accomplishing high storage capacitance can be satisfied.

Moreover, during fabrication of the TFT array substrate, the half-tone patterned photoresist layers are employed in the present application, such that the number of photomasks can be reduced.

In order to make the aforementioned and other features and advantages of the present invention more comprehensible, several embodiments accompanying figures are described in detail below.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention.

DESCRIPTION OF EMBODIMENTS

Figure 1A:
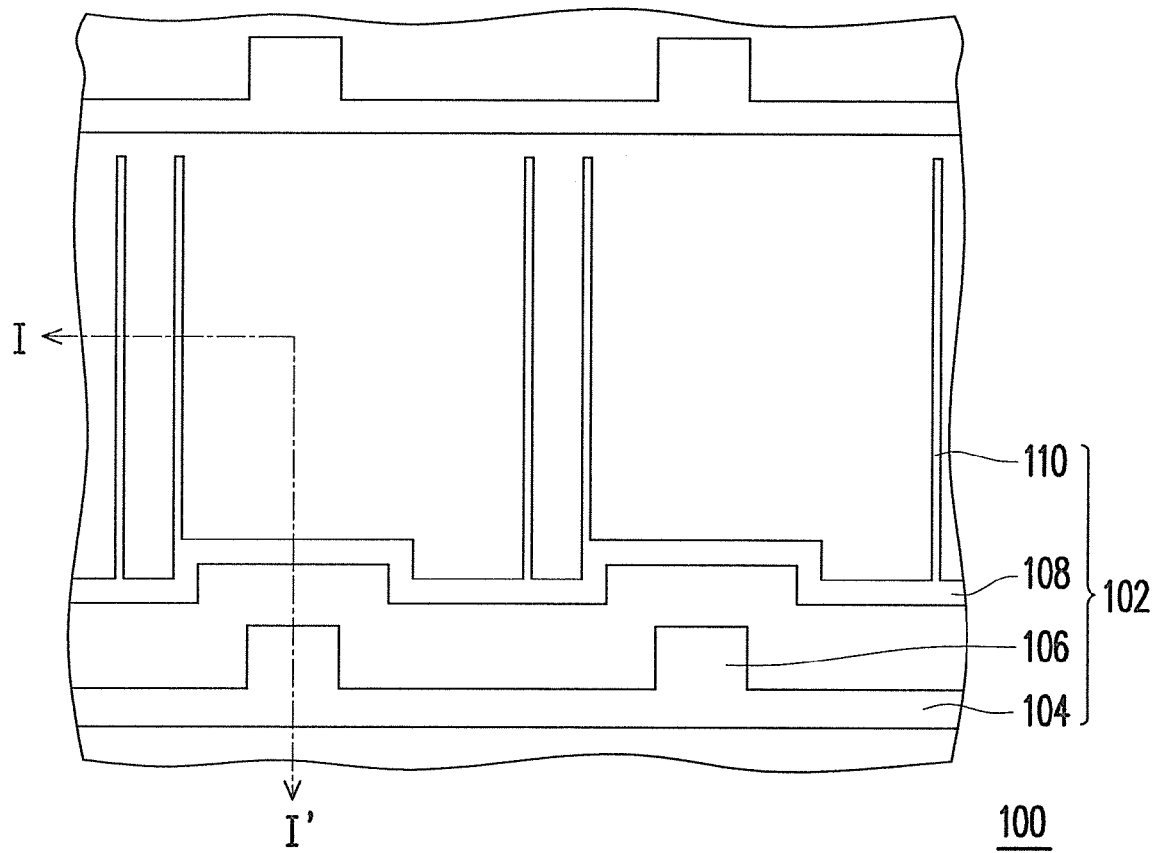
FIGS. 1A to 1E are schematic top views of a TFT array substrate according to an exemplary embodiment of the present invention.

FIGS. 1A to 1E are schematic top views of a TFT array substrate according to an exemplary embodiment of the present invention. FIGS. 2A to 2E are schematic cross-sectional views illustrating the TFT array substrate taken along an I-I' section depicted in FIGS. 1A to 1E. First, as shown in FIGS. 1A and 2A, a patterned conductive layer 102 is formed on a substrate 100. The substrate 100 is made of glass, plastic, or any other appropriate material, for example. The patterned conductive layer 102 is made of metal, for example. Here, the patterned conductive layer 102 includes scan lines 104 and gates 106 connected with the scan lines 104. Besides, the patterned conductive layer 102 may further include a common line 108. A portion of the common line 108 acts as a shielding layer 110, and the shielding layer 110 can be parallel to data lines 124, for example.

Figure 1B:
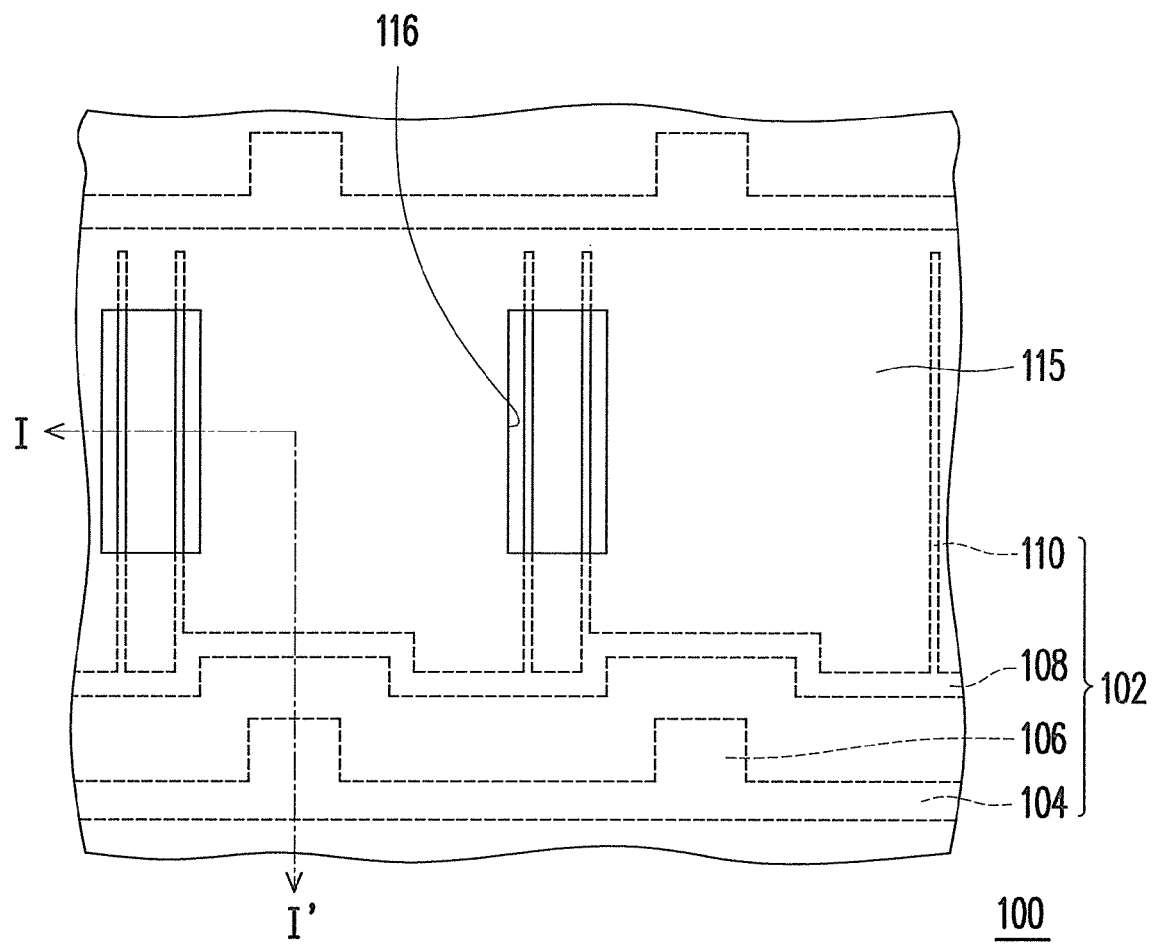
Figure 2A:
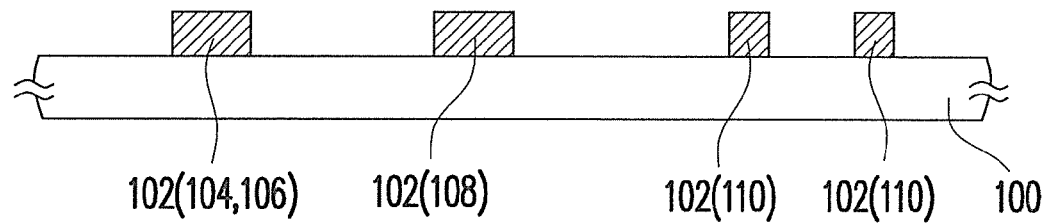
FIGS. 2A to 2E are schematic cross-sectional views illustrating the TFT array substrate taken along an I-I' section depicted in FIGS. 1A to 1E.
Figure 2B:
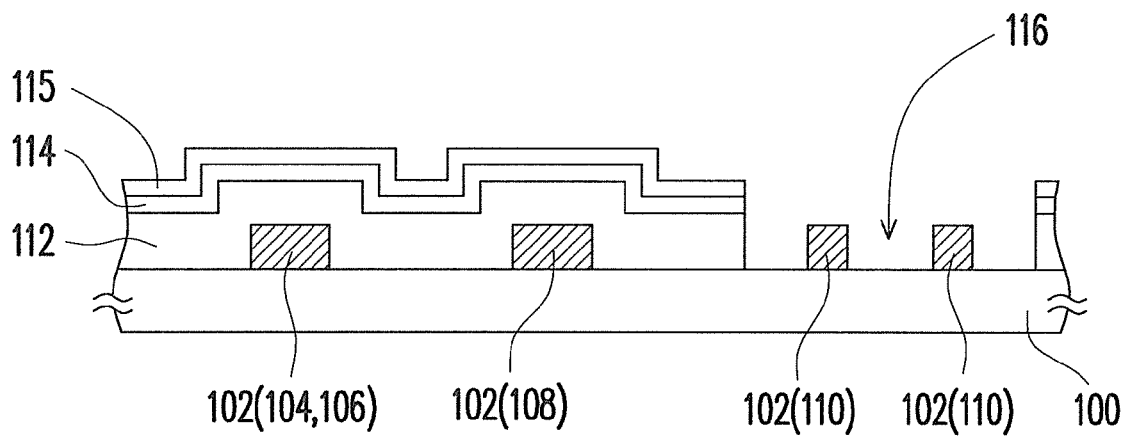

Thereafter, as shown in FIGS. 1B and 2B, an insulating material layer (not shown), a semiconductor material layer (not shown), and an ohmic contact material layer (not shown) are formed on the substrate 100 to cover the patterned conductive layer 102. The insulating material layer is made of silicon oxide, silicon nitride, or any other appropriate dielectric material, for example. A dielectric constant of the insulating material layer ranges from 5 to 9, for example. The semiconductor material layer is made of amorphous silicon, for example. The ohmic contact material layer is made of $n^+$ doped amorphous silicon, for example. Thereafter, the insulating material layer, the semiconductor material layer, and the ohmic contact material layer are patterned to form a patterned gate insulating layer 112, a patterned semiconductor layer 114, and a patterned ohmic contact layer 115. Simultaneously, openings 116 exposing the shielding layer 110 are formed. A method of patterning the insulating material layer, the semiconductor material layer, and the ohmic contact material layer includes first forming a patterned photoresist layer on the ohmic contact material layer. Next, a portion of the ohmic contact material layer, a portion of the semiconductor material layer, and a portion of the insulating material layer are removed by using the patterned photoresist layer as a mask. The patterned photoresist layer is then removed.

Figure 1C:
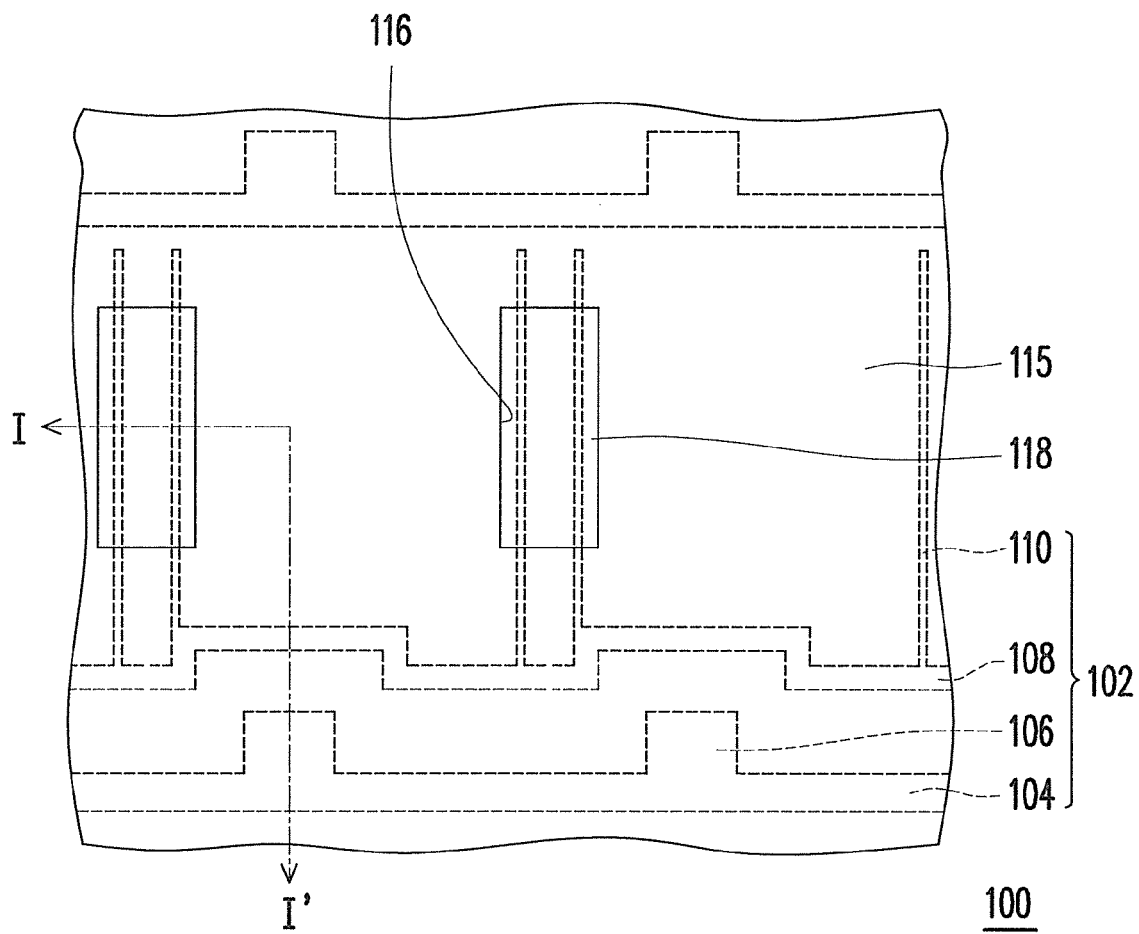
Figure 2C:
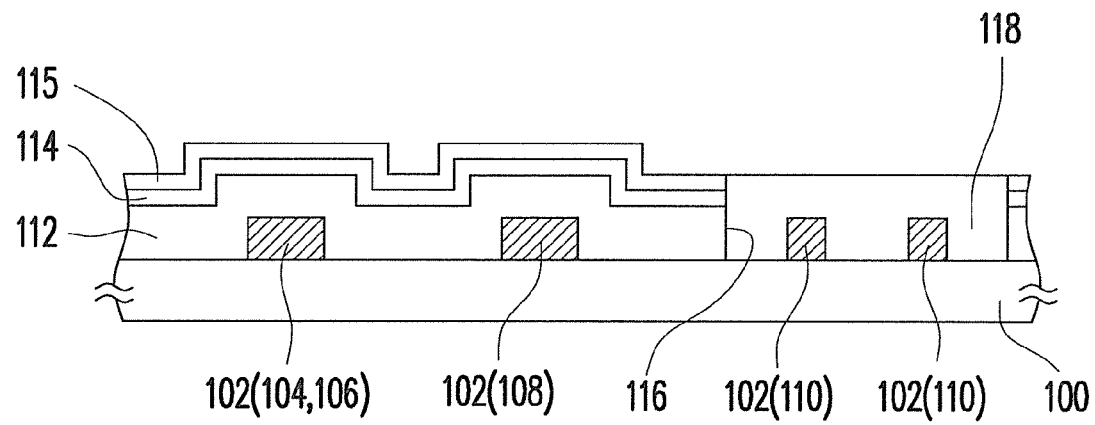

After that, as indicated in FIGS. 1C and 2C, dielectric patterns 118 are formed in the openings 116. A dielectric constant of the dielectric patterns 118 is smaller than a dielectric constant of the patterned gate insulating layer 112. For instance, the dielectric constant of the dielectric patterns 118 ranges from 2 to 4. The dielectric patterns 118 are made of PMMA, HSQ, OSQ, PI, PEN, PET, TSFA, DMMP, or a combination thereof, for example. A method of forming the dielectric patterns 118 includes performing an ink jet printing process, for example. Besides, after implementation of the ink jet printing process, a curing process can be further performed. During the curing process, a thickness of the dielectric patterns 118 is likely to be reduced. Since the dielectric patterns 118 are formed by performing the ink jet printing process, it is not necessary to additionally increase the number of the photomasks which are utilized in the manufacturing process.

Figure 1D:
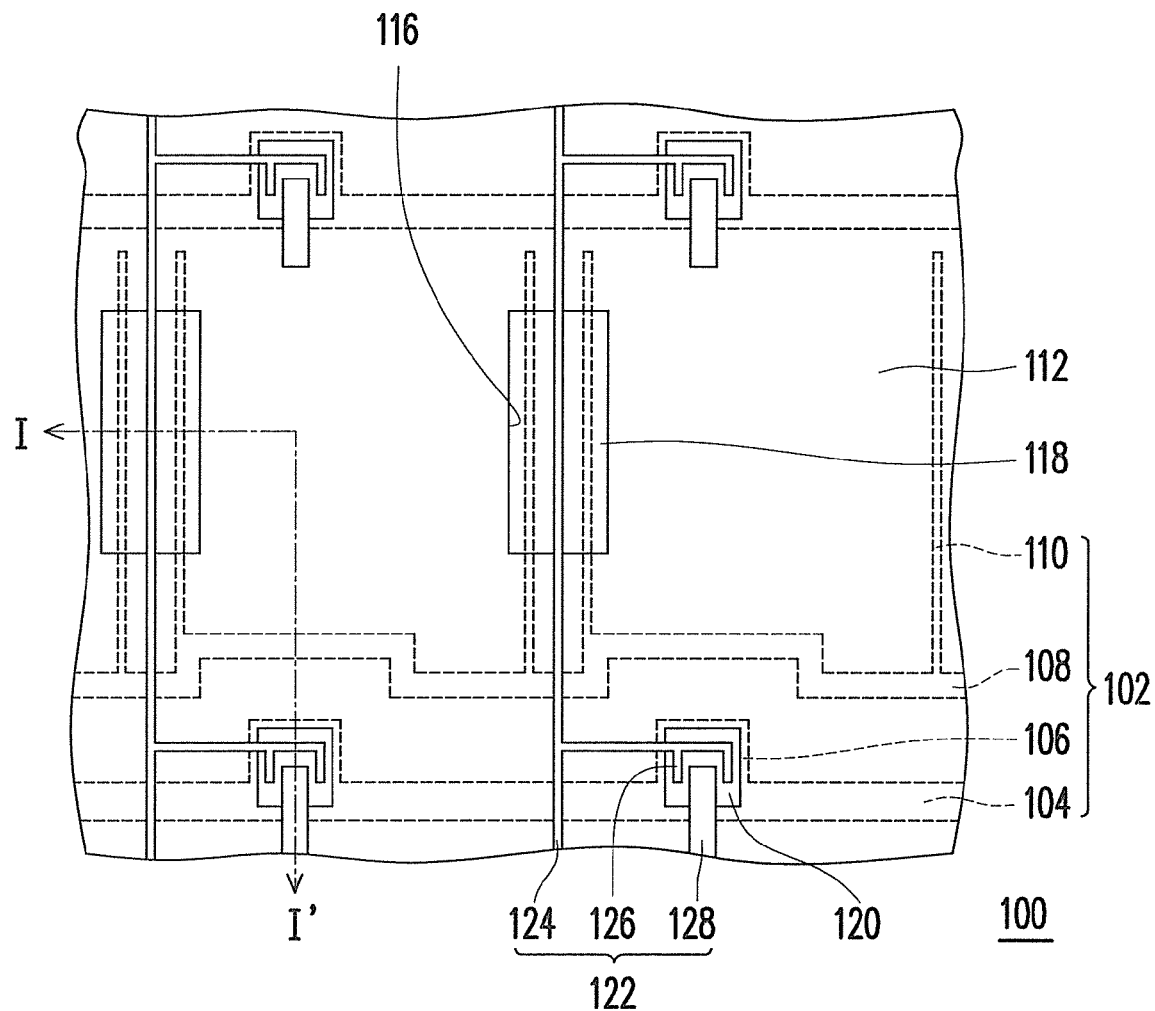
Figure 2D:
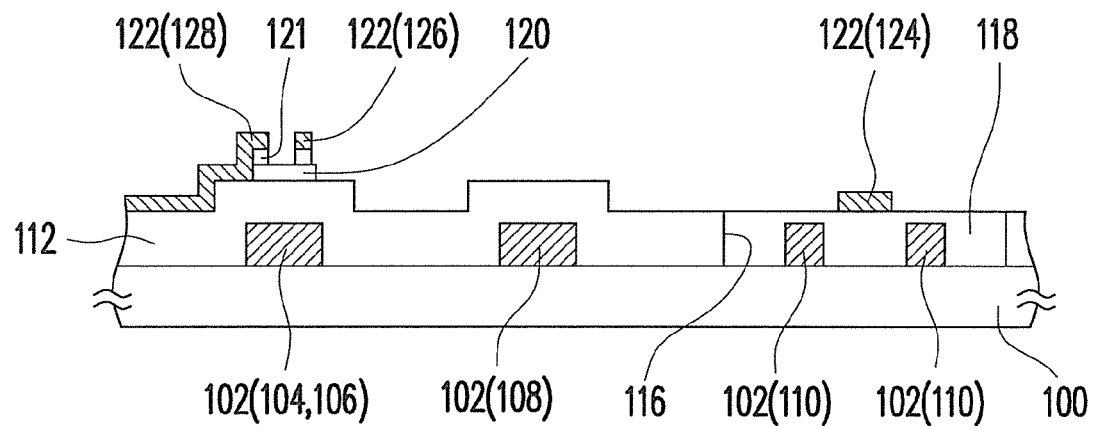

Next, as shown in FIGS. 1D and 2D, semiconductor patterns 120 are formed on the patterned gate insulating layer 112 located above the gates 106, and ohmic contact patterns (not shown) are formed on the semiconductor patterns 120. Here, the semiconductor patterns 120 serve as channel layers. A method of forming the semiconductor patterns 120 and the ohmic contact patterns includes a step of first forming a patterned photoresist layer on the patterned ohmic contact layer 115. Next, a portion of the patterned ohmic contact layer 115 and a portion of the patterned semiconductor layer 114 are removed by using the patterned photoresist layer as a mask. The patterned photoresist layer is then removed.

It should be mentioned that the dielectric patterns 118 are formed prior to formation of the semiconductor patterns 120 and the ohmic contact patterns according to the present embodiment. However, according to another embodiment, the semiconductor patterns 120 and the ohmic contact patterns can be formed prior to formation of the dielectric patterns 118.

Moreover, in another embodiment, the method of forming the patterned gate insulating layer 112, the dielectric patterns 118, the semiconductor patterns 120, and the ohmic contact patterns can include a step of sequentially forming the insulating material layer, the semiconductor material layer, and the ohmic contact material layer on the substrate 100 at first to cover the patterned conductive layer 102. After that, a half-tone patterned photoresist layer is formed on the ohmic contact material layer. The half-tone patterned photoresist layer has a first portion and a second portion, and a thickness of the first portion is greater than a thickness of the second portion. A portion of the ohmic contact material layer, a portion of the semiconductor material layer, and a portion of the insulating material layer are then removed by using the half-tone patterned photoresist layer as a mask to form the patterned gate insulating layer 112, the patterned semiconductor layer 114, and the patterned ohmic contact layer 115 are formed. Simultaneously, the openings 116 exposing the shielding layer 110 are formed. Next, the dielectric patterns 118 are formed in the openings 116. Thereafter, a thickness of the half-tone patterned photoresist layer is reduced until the second portion of the half-tone patterned photoresist layer is removed, such that the second patterned photoresist layer is formed. Afterward, a portion of the patterned ohmic contact layer 115 and a portion of the patterned semiconductor layer 114 are removed by using the second patterned photoresist layer as a mask. The second patterned photoresist layer is then removed.

With reference to FIGS. 1D and 2D, a patterned conductive layer 122 is formed on the ohmic contact patterns, the patterned gate insulating layer 112, and the dielectric patterns 118. The patterned conductive layer 122 includes data lines 124, sources 126 connected with the data lines 124, and drains 128. Here, the patterned conductive layer 122 is made of metal, for example. A method of forming the patterned conductive layer 122 includes a step of first forming a conductive material layer (not shown) on the substrate 100. A photolithography and etching process is then carried out. Additionally, a portion of the ohmic contact patterns is removed during formation of the patterned conductive layer 122, such that the ohmic contact layer 121 is formed. The shielding layer 110 is substantially located below the data lines 124.

In the present embodiment, the dielectric patterns 118 cover a portion of the common line 108 (i.e. a portion of the shielding layer 110), and the dielectric patterns 118 are located between a portion of the shielding layer 110 and a portion of the data lines 124. Since the dielectric patterns 118 are made of materials with low dielectric constants, parasitic capacitance can be avoided, an RC delay defect can be further remedied, and a signal response time can be further shortened.

Figure 1E:
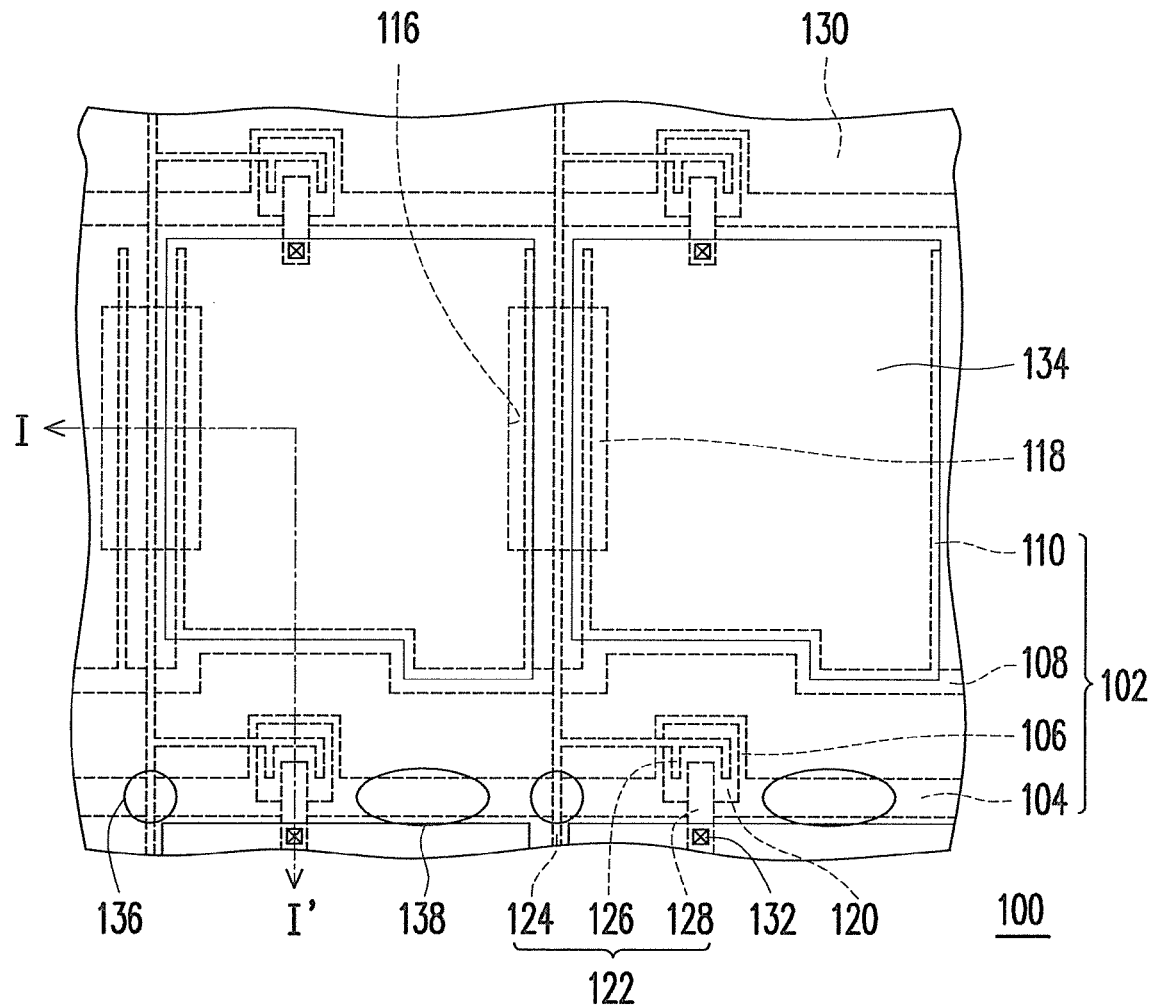
Figure 2E:
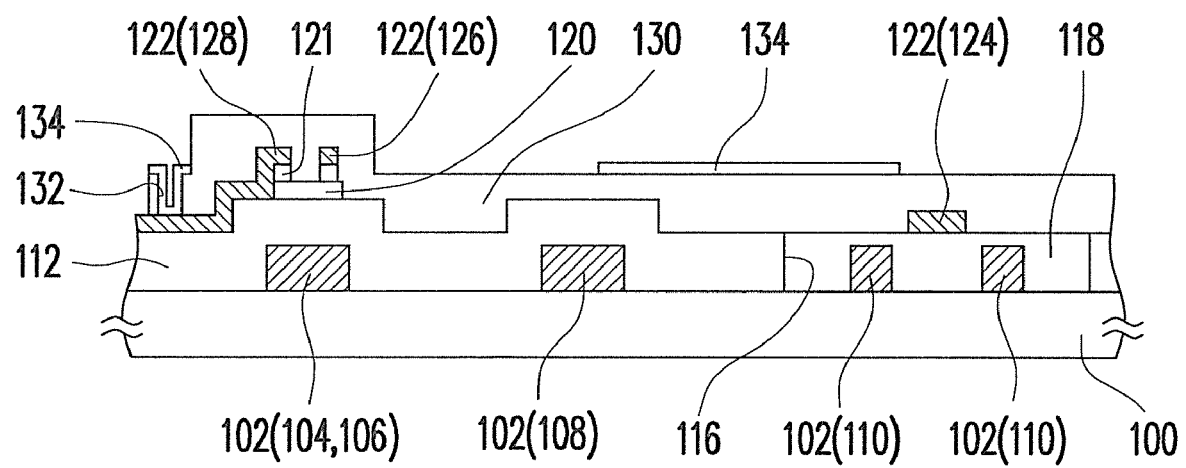

Afterward, as shown in FIGS. 1E and 2E, a passivation layer 130 is formed to cover the patterned conductive layer 122, the semiconductor patterns 120, the patterned gate insulating layer 112, and the dielectric patterns 118. The passivation layer 130 has openings 132 exposing a portion of the drains 128. Next, pixel electrodes 134 are formed on the passivation layer 130. The pixel electrodes 134 are electrically connected with the drains 128 through the openings 132 correspondingly. Here, the pixel electrodes 134 are made of indium tin oxide (ITO) or indium zinc oxide (IZO), for example.

According to the present embodiment, the dielectric patterns 118 having the low dielectric constant are arranged between a portion of the shielding layer 110 and a portion of the data lines 124, and therefore it is likely to prevent the parasitic capacitance from being generated between the shielding layer 110 and the data lines 124. As such, the RC delay defect can be remedied. Moreover, the dielectric patterns having the low dielectric constant not only can be arranged between a portion of the shielding layer 110 and a portion of the data lines 124 but also can be disposed in other regions where the parasitic capacitance is apt to be generated. For instance, in the region 136 shown in FIG. 1E, the patterned gate insulating layer 112 located at intersections between the scan lines 104 and the data lines 124 can be replaced by the dielectric patterns having the low dielectric constant (formation of the dielectric patterns is described in the above-mentioned embodiments) so as to prevent generation of the parasitic capacitance between the scan lines 104 and the data lines 124. In addition, the patterned gate insulating layer 112 on the scan line 104 in the region 138 shown in FIG. 1E can also be replaced by the dielectric patterns having the low dielectric constant so as to prevent generation of the parasitic capacitance between the scan lines 104 and the common line 108.

Based on the above, the gate insulating layer disposed between a portion of the shielding layer 110 and a portion of the data lines 124, at intersections between the scan lines 104 and the data lines 124, or on a portion of the scan lines 104 is replaced by the dielectric patterns having the low dielectric constant. Thereby, parasitic capacitance is not generated in the aforesaid regions, such that the RC delay defect is remedied.

Besides, since the RC delay defect is remedied in the present application, a double-side driving circuit design is not required. Therefore, the number of driving devices can be reduced, and so can the manufacturing costs.

On the other hand, the insulating materials having different dielectric constants are disposed in different regions according to the present application. Thereby, design demands for stabilizing TFT device properties and accomplishing high storage capacitance can be satisfied.

Moreover, it should be mentioned that the half-tone patterned photoresist layer can be further formed in the aforesaid manufacturing process to reduce the number of the photomasks required in the manufacturing process and to reduce the costs as well.

Two embodiments are provided hereinafter to elaborate the manufacturing process of the TFT array substrate. Note that identical elements in FIGS. 2A to 2E and in the following figures are marked by the same reference numbers.

Figure 3A:
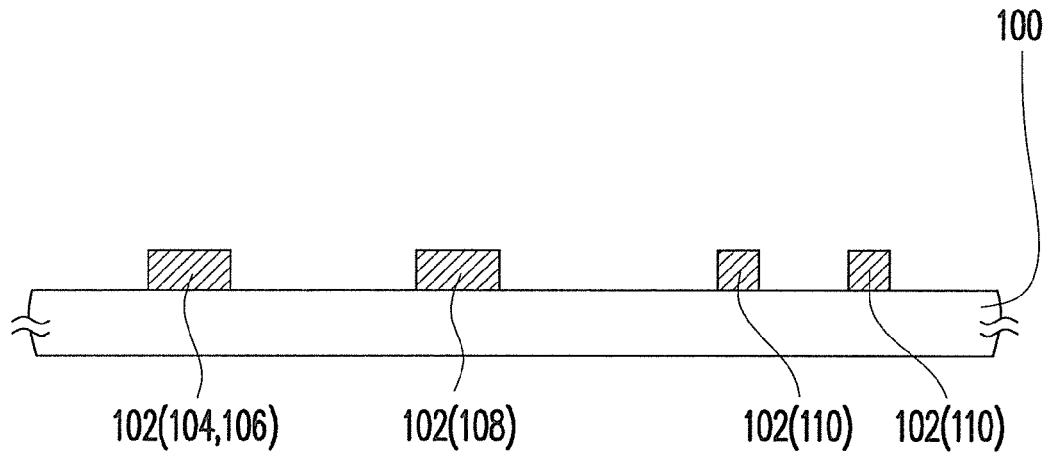
FIGS. 3A to 3H are cross-sectional flow charts illustrating a manufacturing process of a TFT array substrate according to another exemplary embodiment of the present invention.

FIGS. 3A to 3H are cross-sectional flow charts illustrating a manufacturing process of a TFT array substrate according to another exemplary embodiment of the present invention. Capacitance generated in the present embodiment is generally referred to as metal-insulator-metal (MIM) capacitance. First, as shown in FIG. 3A, the patterned conductive layer 102 is formed on the substrate 100.

Figure 3B:
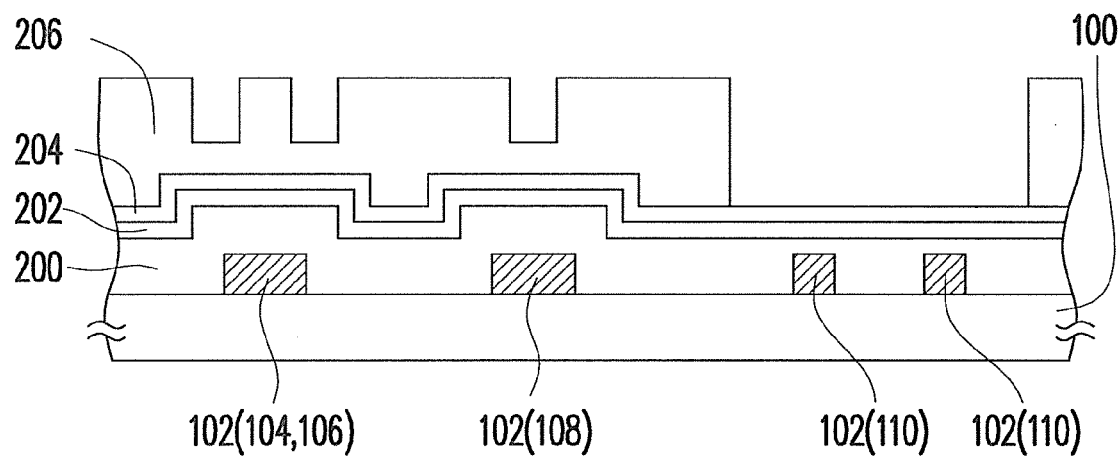

Next, with reference to FIG. 3B, an insulating material layer 200, a semiconductor material layer 202, and an ohmic contact material layer 204 are sequentially formed on the substrate 100 to cover the patterned conductive layer 102. A half-tone patterned photoresist layer 206 is then formed above the substrate 100. The half-tone patterned photoresist layer 206 has a first portion and a second portion, and a thickness of the first portion is greater than a thickness of the second portion.

Figure 3C:
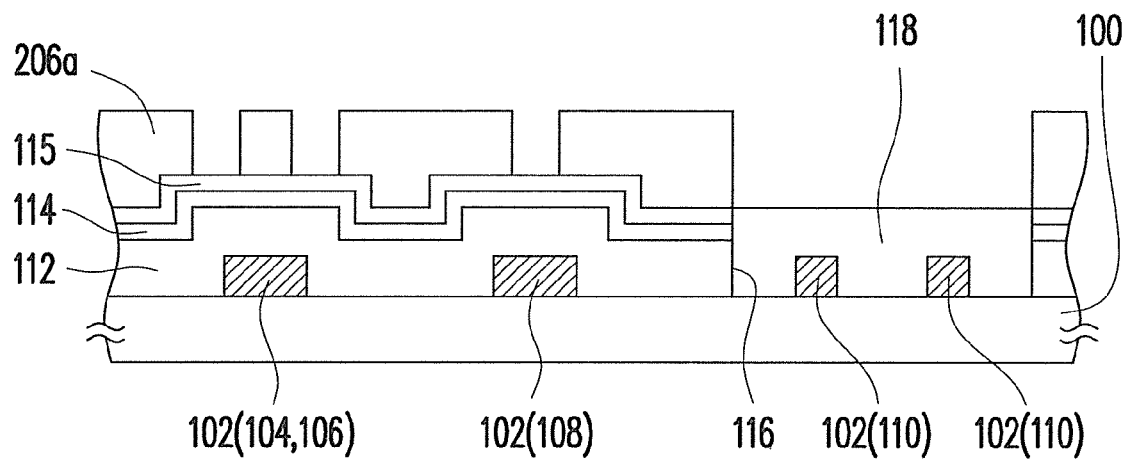

Thereafter, as shown in FIG. 3C, a portion of the ohmic contact material layer 204, a portion of the semiconductor material layer 202, and a portion of the insulating material layer 200 are removed by using the half-tone patterned photoresist layer 206 as a mask, such that the patterned ohmic contact layer 115 having the openings 116, the patterned semiconductor layer 114, and the patterned gate insulating layer 112 are formed. After that, a thickness of the half-tone patterned photoresist layer 206 is reduced until the second portion of the half-tone patterned photoresist layer 206 is removed, such that a patterned photoresist layer 206a is formed. The dielectric patterns 118 are then formed in the openings 116. Here, a dielectric constant of the dielectric patterns 118 is smaller than a dielectric constant of the patterned gate insulating layer 112.

Figure 3D:
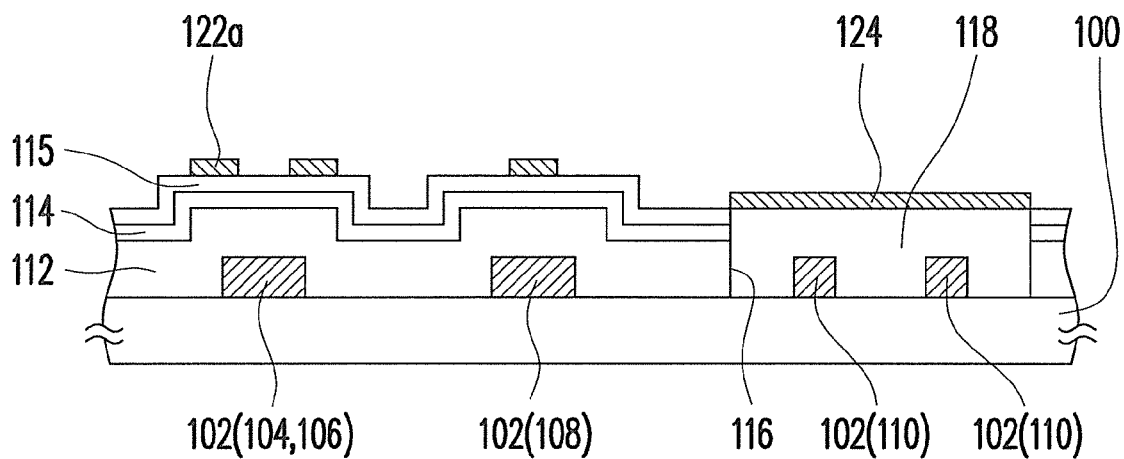

Next, as indicated in FIG. 3D, a conductive material layer (not shown) is deposited on the substrate 100, and the conductive material layer located on the patterned photoresist layer 206a is removed during a lift-off process performed on the patterned photoresist layer 206a, such that a patterned conductive layer 122a is formed. Here, the patterned conductive layer 122a includes the data lines 124, the sources connected with the data lines 124, and the drains. The shielding layer 110, for instance, is entirely or partially shielded by the data lines 124 and is located below the data lines 124.

Figure 3E:
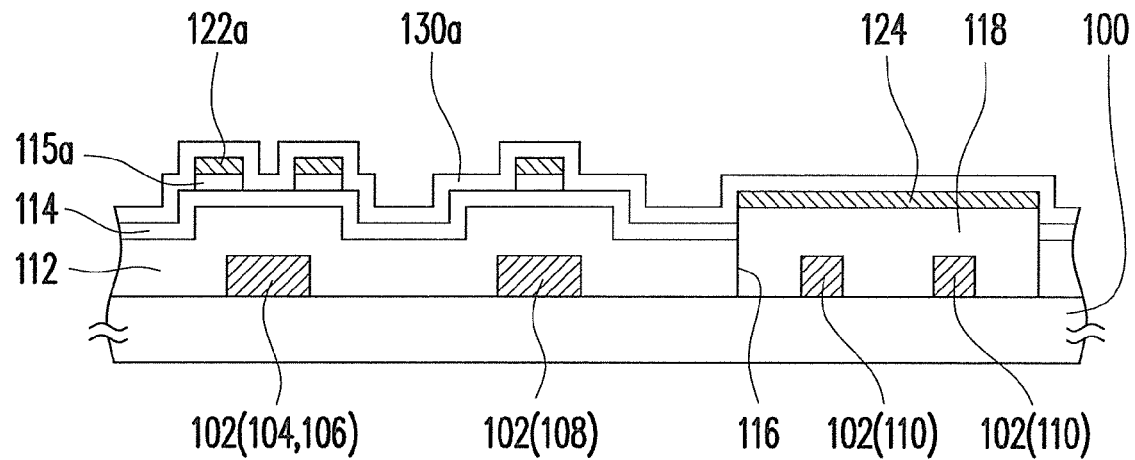

Next, with reference to FIG. 3E, a portion of the patterned ohmic contact layer 115 is removed by using the patterned conductive layer 122a as a mask, such that an ohmic contact layer 115a is formed. After that, a passivation layer 130a is formed on the patterned semiconductor layer 114 and the patterned conductive layer 122a.

Figure 3F:
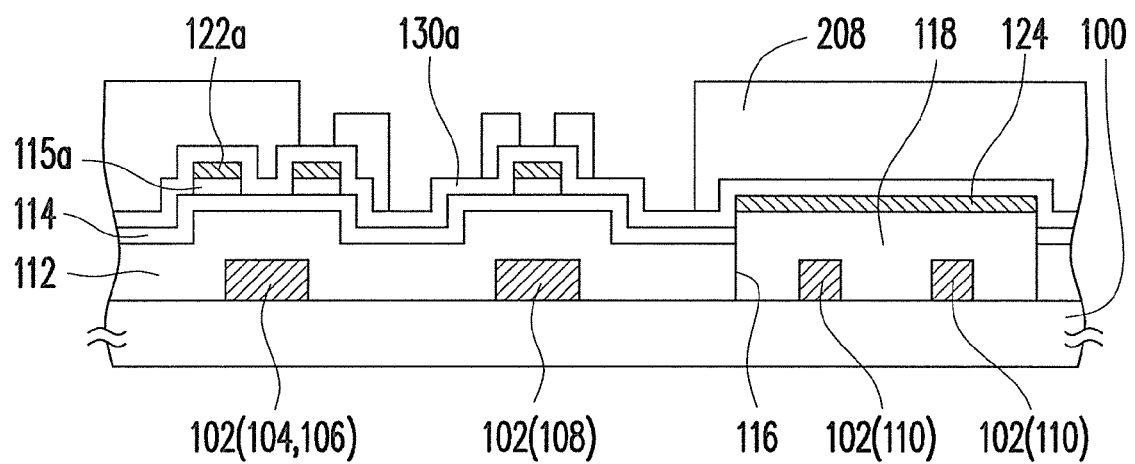

As shown in FIG. 3F, a half-tone patterned photoresist layer 208 is then formed on the substrate 100. The half-tone patterned photoresist layer 208 has a third portion and a fourth portion, and a thickness of the third portion is greater than a thickness of the fourth portion.

Figure 3G:
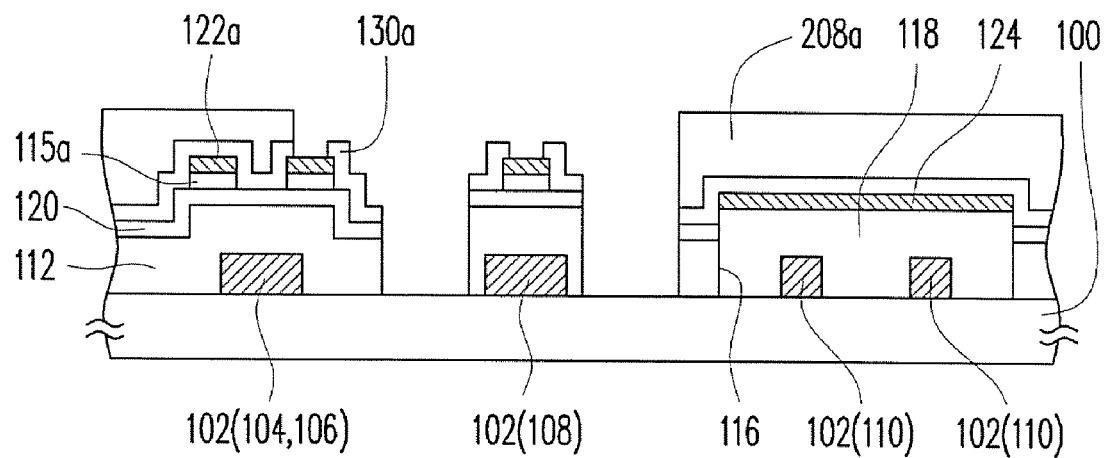

Next, as indicated in FIG. 3G, a portion of the passivation layer 130a, a portion of the patterned semiconductor layer 114, and a portion of the patterned gate insulating layer 112 are then removed by using the half-tone patterned photoresist layer 208 as a mask so as to form a plurality of semiconductor patterns 120 disposed on the patterned gate insulating layer 112. Here, the semiconductor patterns 120 serve as channel layers separated from one another. After that, a thickness of the half-tone patterned photoresist layer 208 is reduced until the fourth portion of the half-tone patterned photoresist layer 208 is removed, such that a patterned photoresist layer 208a is formed.

Figure 3H:
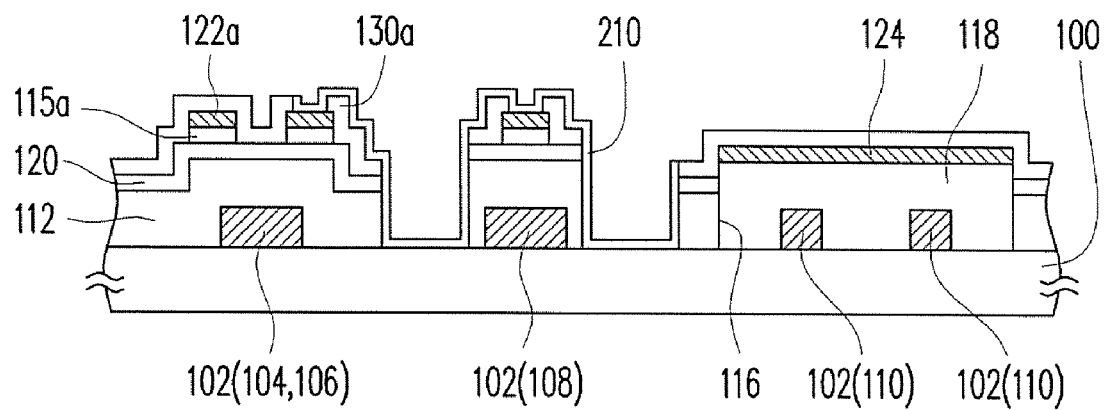

Next, as shown in FIG. 3H, a pixel electrode material layer (not shown) is deposited on the substrate 100, and the pixel electrode material layer located on the patterned photoresist layer 208a is removed during a lift-off process performed on the patterned photoresist layer 208a, such that pixel electrodes 210 are formed. Each of the pixel electrodes 210 is electrically connected with one of the drains, respectively.

Figure 4A:
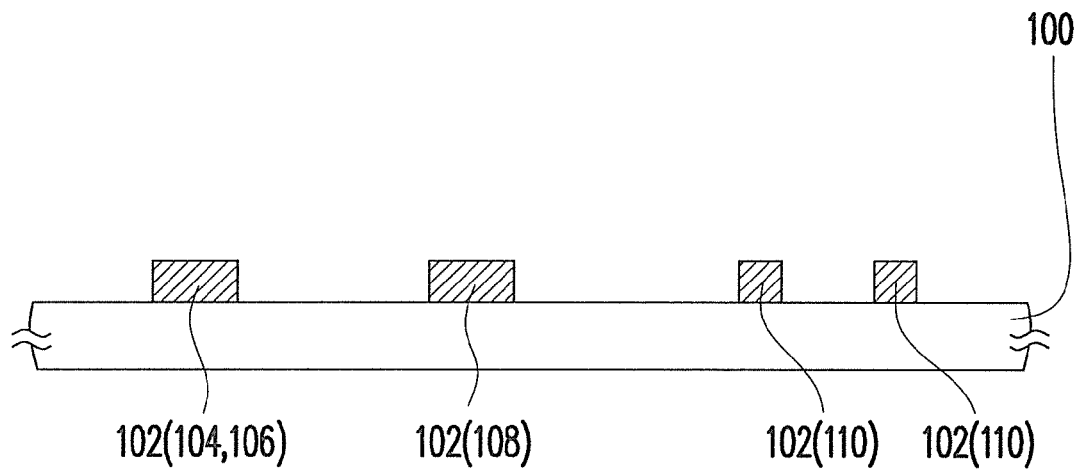
FIGS. 4A to 4H are cross-sectional flow charts illustrating a manufacturing process of a TFT array substrate according to still another exemplary embodiment of the present invention.

FIGS. 4A to 4H are cross-sectional flow charts illustrating a manufacturing process of a TFT array substrate according to still another exemplary embodiment of the present invention. Capacitance generated in the present embodiment is generally referred to as the MIM capacitance. First, as shown in FIG. 4A, the patterned conductive layer 102 is formed on the substrate 100.

Figure 4B:
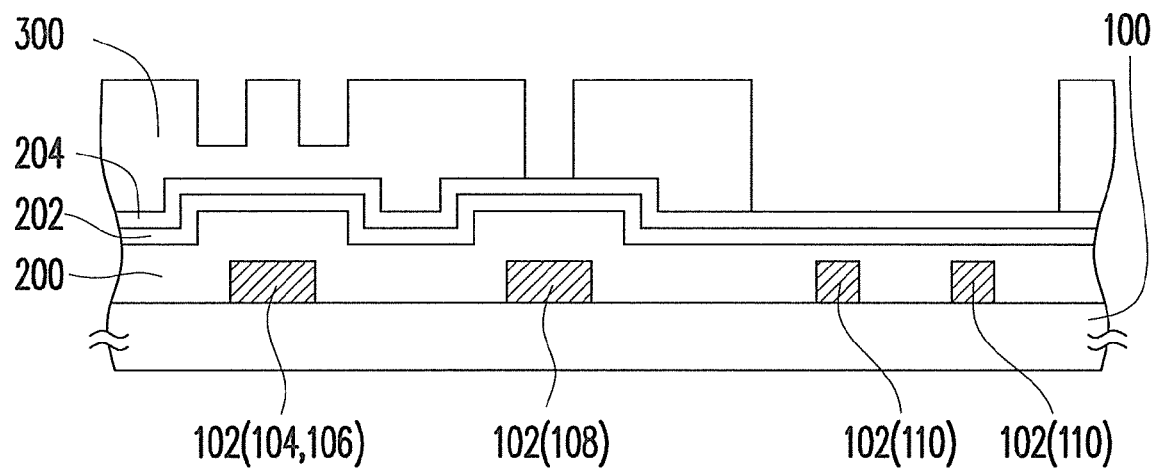

Next, with reference to FIG. 4B, an insulating material layer 200, a semiconductor material layer 202, and an ohmic contact material layer 204 are sequentially formed on the substrate 100 to cover the patterned conductive layer 102. A half-tone patterned photoresist layer 300 is then formed on the substrate 100. The half-tone patterned photoresist layer 300 has a first portion and a second portion, and a thickness of the first portion is greater than a thickness of the second portion. Here, the half-tone patterned photoresist layer 300 partially exposes a region above the common line 108.

Figure 4C:
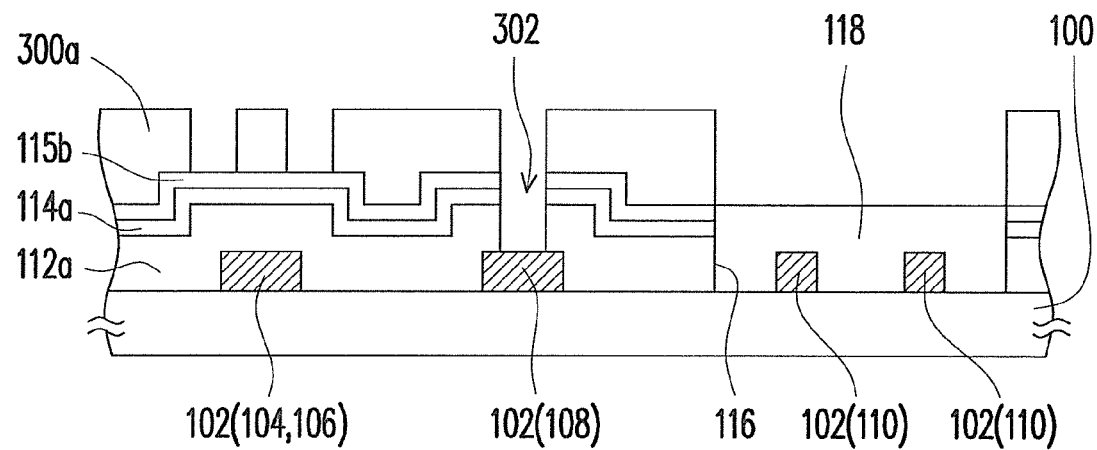

Thereafter, as shown in FIG. 4C, a portion of the ohmic contact material layer 204, a portion of the semiconductor material layer 202, and a portion of the insulating material layer 200 are removed by using the half-tone patterned photoresist layer 300 as a mask, such that a patterned ohmic contact layer 115b having the openings 116 and openings 302, a patterned semiconductor layer 114a, and a patterned gate insulating layer 112a are formed. The openings 302 expose a portion of the common line 108. After that, a thickness of the half-tone patterned photoresist layer 300 is reduced until the second portion of the half-tone patterned photoresist layer 300 is removed, such that a patterned photoresist layer 300a is formed. The dielectric patterns 118 are then formed in the openings 116. Here, a dielectric constant of the dielectric patterns 118 is smaller than a dielectric constant of the patterned gate insulating layer 112a.

Figure 4D:
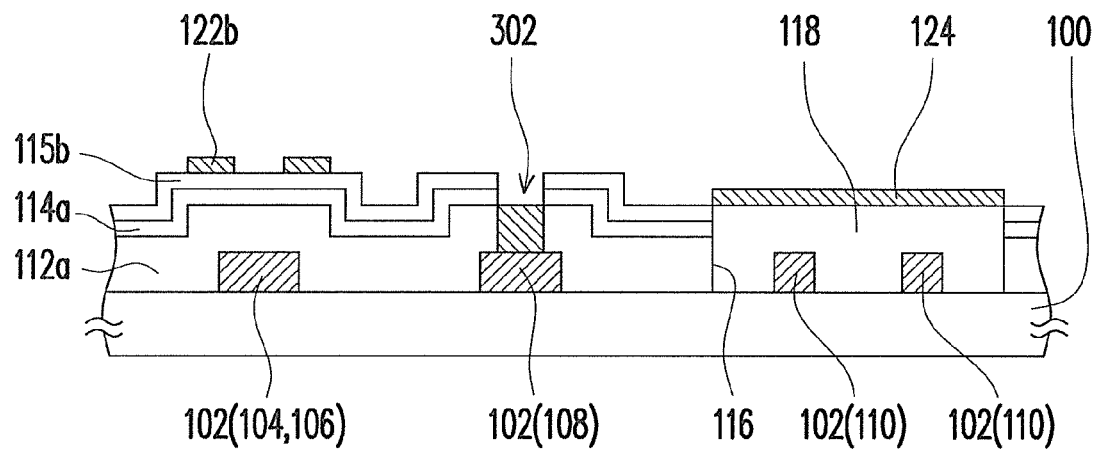

Next, as indicated in FIG. 4D, a conductive material layer (not shown) is deposited on the substrate 100, and the conductive material layer located on the patterned photoresist layer 300a is removed during a lift-off process performed on the patterned photoresist layer 300a, such that a patterned conductive layer 122b is formed. Here, the patterned conductive layer 122b includes the data lines 124, the sources connected with the data lines 124, and the drains. The openings 302 are filled with a portion of the patterned conductive layer 122b. The shielding layer 110, for instance, is entirely or partially shielded by the data lines 124 and is located below the data lines 124.

Figure 4E:
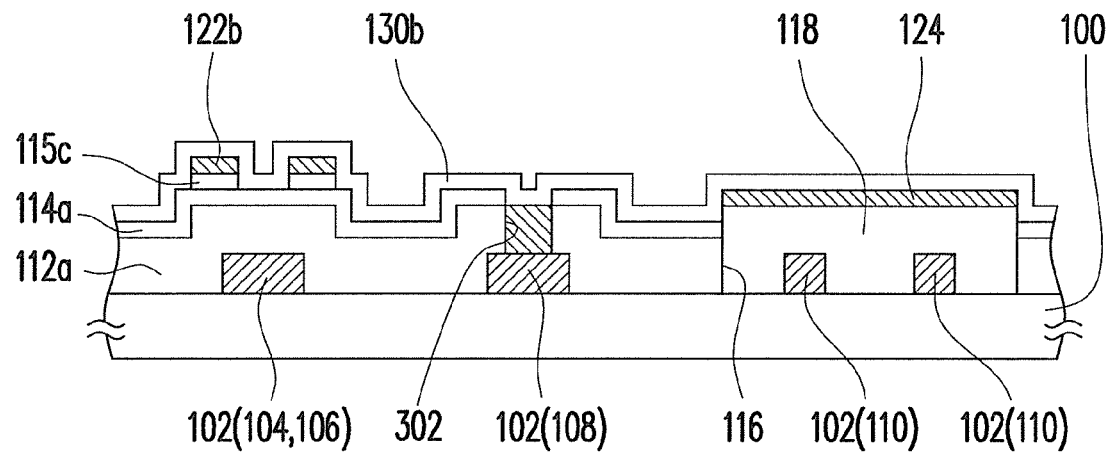

Next, with reference to FIG. 4E, a portion of the patterned ohmic contact layer 115b is removed by using the patterned conductive layer 122b as a mask, such that an ohmic contact layer 115c is formed. After that, a passivation layer 130b is formed on the patterned semiconductor layer 114a and the patterned conductive layer 122b.

Figure 4F:
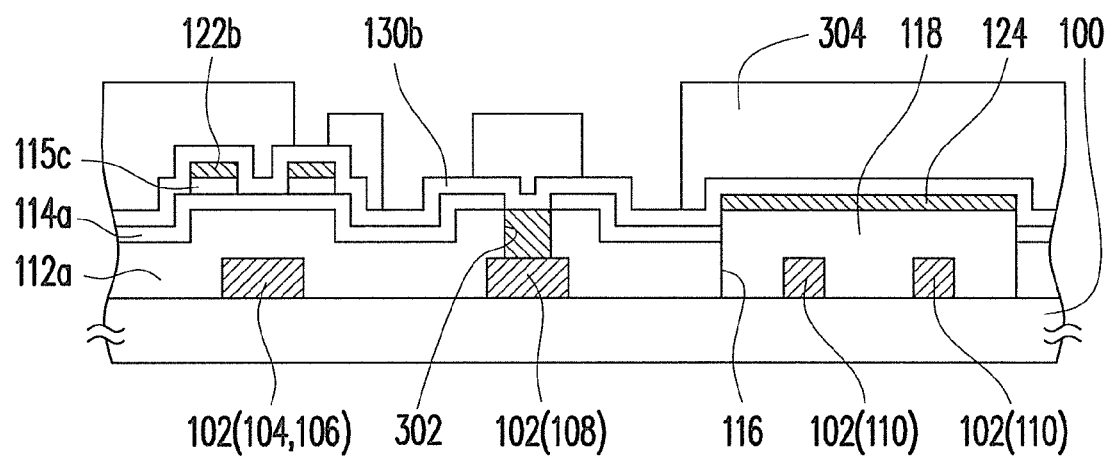

As shown in FIG. 4F, a half-tone patterned photoresist layer 304 is then formed on the substrate 100. The half-tone patterned photoresist layer 304 has a third portion and a fourth portion, and a thickness of the third portion is greater than a thickness of the fourth portion.

Figure 4G:
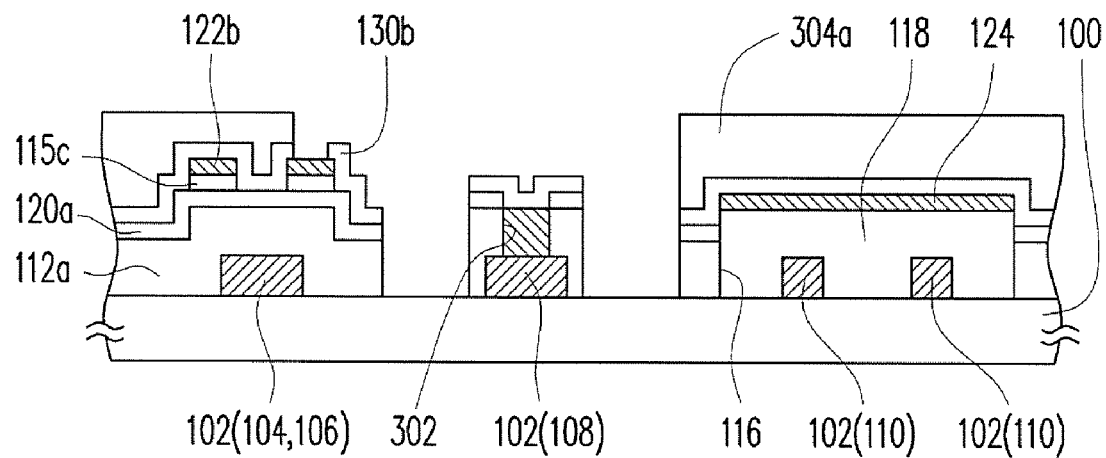

Next, as indicated in FIG. 4G, a portion of the passivation layer 130b, a portion of the patterned semiconductor layer 114a, and a portion of the patterned gate insulating layer 112a are then removed by using the half-tone patterned photoresist layer 304 as a mask so as to form a plurality of semiconductor patterns 120a disposed on the patterned gate insulating layer 112a. Here, the semiconductor patterns 120a serve as channel layers separated from one another. After that, a thickness of the half-tone patterned photoresist layer 304 is reduced until the fourth portion of the half-tone patterned photoresist layer 304 is removed, such that a patterned photoresist layer 304a is formed.

Figure 4H:
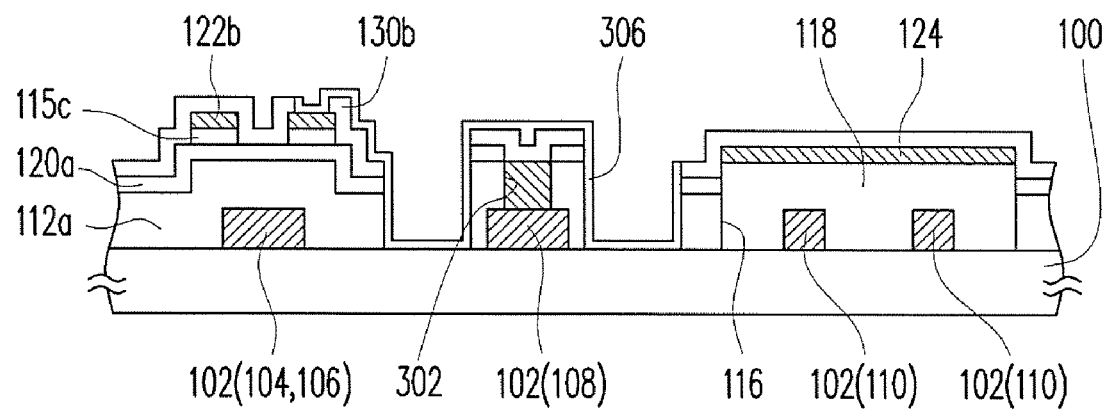

After that, as shown in FIG. 4H, a pixel electrode material layer (not shown) is deposited on the substrate 100, and the pixel electrode material layer located on the patterned photoresist layer 304a is removed during a lift-off process performed on the patterned photoresist layer 304a, such that pixel electrodes 306 are formed. Each of the pixel electrodes 306 is electrically connected with one of the drains, respectively.

In the two embodiments discussed above, less than five photomasks are used, thereby reducing the manufacturing costs.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A thin film transistor array substrate, comprising:
    a substrate;
    a first patterned conductive layer disposed on the substrate, the first patterned conductive layer comprising a plurality of scan lines and a plurality of gates connected with the scan lines;
    a patterned gate insulating layer disposed on the substrate to cover the first patterned conductive layer, the patterned gate insulating layer having a plurality of openings;
    a plurality of dielectric patterns located in the openings, a dielectric constant of the dielectric patterns being smaller than a dielectric constant of the patterned gate insulating layer;
    a plurality of semiconductor patterns disposed on the patterned gate insulating layer, the semiconductor patterns comprising a plurality of channel layers separated from one another;
    a second patterned conductive layer disposed on the semiconductor patterns, and the dielectric patterns, the second patterned conductive layer comprising a plurality of data lines, a plurality of sources connected with the data lines, and a plurality of drains;
    a passivation layer disposed on the semiconductor patterns, the patterned gate insulating layer, and the dielectric patterns to cover the second patterned conductive layer; and
    a plurality of pixel electrodes disposed on the passivation layer, each of the pixel electrodes being electrically connected with corresponding one of the drains, respectively.

2. The thin film transistor array substrate as claimed in claim 1, wherein locations of the dielectric patterns correspond to intersections of the scan lines and the data lines.

3. The thin film transistor array substrate as claimed in claim 1, wherein the dielectric constant of the patterned gate insulating layer ranges from 5 to 9, and the dielectric constant of the dielectric patterns ranges from 2 to 4.

4. The thin film transistor array substrate as claimed in claim 1, wherein the dielectric patterns are located on the scan lines.

5. The thin film transistor array substrate as claimed in claim 1, wherein the first patterned conductive layer further comprises a common line, a portion of the common line is covered by the dielectric patterns, and the dielectric patterns are located between a portion of the common line and a portion of the data lines.

6. The thin film transistor array substrate as claimed in claim 1, wherein a material of the dielectric patterns comprises polymethylmethacrylate, hydrogen silsesquioxane, organic silsesquioxane, polyimide, poly(ethylene 2,6-napthalate), polyethyleneterephthalate, tri-phenylsulfonium hexafluoroantimonate salt, dimethyl methylphosphonate, or a combination thereof.

7. A manufacturing method of a thin film transistor array substrate, comprising:
    forming a first patterned conductive layer on a substrate, the first patterned conductive layer comprising a plurality of scan lines and a plurality of gates connected with the scan lines;
    forming a patterned gate insulating layer having a plurality of openings on the substrate to cover the first patterned conductive layer and forming a plurality of dielectric patterns in the openings, wherein a dielectric constant of the dielectric patterns is smaller than a dielectric constant of the patterned gate insulating layer;
    forming a plurality of semiconductor patterns on the patterned gate insulating layer, the semiconductor patterns comprising a plurality of channel layers separated from one another;
    forming a second patterned conductive layer on the semiconductor patterns, and the dielectric patterns, the second patterned conductive layer comprising a plurality of data lines, a plurality of sources connected with the data lines, and a plurality of drains;
    forming a passivation layer on the semiconductor patterns, the patterned gate insulating layer, and the dielectric patterns to cover the second patterned conductive layer; and
    forming a plurality of pixel electrodes on the passivation layer, each of the pixel electrodes being electrically connected with corresponding one of the drains, respectively.

8. The manufacturing method as claimed in claim 7, wherein the steps of forming the patterned gate insulating layer, the semiconductor patterns, and the dielectric patterns comprise:
    sequentially forming an insulating material layer and a semiconductor material layer on the substrate to cover the gates;
    forming a first patterned photoresist layer on the semiconductor material layer; removing a portion of the semiconductor material layer and a portion of the insulating material layer by using the first patterned photoresist layer as a mask to form the patterned gate insulating layer having the openings;
    forming the dielectric patterns in the openings;
    forming a second patterned photoresist layer on the semiconductor material layer that is not removed; and
    removing another portion of the semiconductor material layer by using the second patterned photoresist layer as a mask to form the semiconductor patterns.

9. The manufacturing method as claimed in claim 8, wherein a method of forming the dielectric patterns comprises performing an ink jet printing process.

10. The manufacturing method as claimed in claim 9, wherein a method of forming the dielectric patterns further comprises performing a curing process after the ink jet printing process is performed.

11. The manufacturing method as claimed in claim 8, wherein the dielectric patterns are formed before the semiconductor patterns are formed.

12. The manufacturing method as claimed in claim 8, wherein the dielectric patterns are formed after the semiconductor patterns are formed.

13. The manufacturing method as claimed in claim 7, wherein the steps of forming the patterned gate insulating layer, the semiconductor patterns, and the dielectric patterns comprise:
   sequentially forming an insulating material layer and a semiconductor material layer on the substrate to cover the first patterned conductive layer;
   forming a half-tone patterned photoresist layer on the semiconductor material layer, the half-tone patterned photoresist layer having a first portion and a second portion, a thickness of the first portion being greater than a thickness of the second portion;
   removing a portion of the semiconductor material layer and a portion of the insulating material layer by using the half-tone patterned photoresist layer as a mask to form the patterned gate insulating layer having the openings;
   forming the dielectric patterns in the openings;
   reducing a thickness of the half-tone patterned photoresist layer until the second portion of the half-tone patterned photoresist layer is removed to form a second patterned photoresist layer; and
   removing another portion of the semiconductor material layer by using the second patterned photoresist layer as a mask to form the semiconductor patterns.

14. The manufacturing method as claimed in claim 13, wherein a method of forming the dielectric patterns comprises performing an ink jet printing process.

15. The manufacturing method as claimed in claim 14, wherein a method of forming the dielectric patterns further comprises performing a curing process after the ink jet printing process is performed.

16. The manufacturing method as claimed in claim 7, wherein the dielectric patterns are formed before the semiconductor patterns are formed.

17. The manufacturing method as claimed in claim 13, wherein the dielectric patterns are formed before the second patterned photoresist layer is formed.

18. The manufacturing method as claimed in claim 7, wherein the dielectric patterns are formed after the semiconductor patterns are formed.

19. A manufacturing method of a thin film transistor array substrate, the manufacturing method comprising:
   forming a first patterned conductive layer on a substrate, the first patterned conductive layer comprising a plurality of scan lines and a plurality of gates connected with the scan lines;
   sequentially forming an insulating material layer, a semiconductor material layer, and an ohmic contact material layer on the substrate to cover the first patterned conductive layer;
   forming a first half-tone patterned photoresist layer on the substrate, the first half-tone patterned photoresist layer having a first portion and a second portion, a thickness of the first portion being greater than a thickness of the second portion;
   removing a portion of the ohmic contact material layer, a portion of the semiconductor material layer, and a portion of the insulating material layer by using the first half-tone patterned photoresist layer as a mask to form a patterned ohmic contact material layer, a patterned semiconductor layer, and a patterned gate insulating layer, wherein a plurality of openings are at least formed in the patterned gate insulating layer;
   reducing a thickness of the first half-tone patterned photoresist layer until the second portion of the first half-tone patterned photoresist layer is removed to form a first patterned photoresist layer;
   forming a plurality of dielectric patterns in the openings, a dielectric constant of the dielectric patterns being smaller than a dielectric constant of the patterned gate insulating layer;
   forming a second patterned conductive layer on a region exposed by the first patterned photoresist layer, the second patterned conductive layer comprising a plurality of data lines, a plurality of sources connected with the data lines, and a plurality of drains;
   removing the first patterned photoresist layer; removing a portion of the patterned ohmic contact material layer by using the second patterned conductive layer as a mask;
   forming a passivation layer on the patterned semiconductor layer and the second patterned conductive layer;
   forming a second half-tone patterned photoresist layer on the substrate, the second half-tone patterned photoresist layer having a third portion and a fourth portion, a thickness of the third portion being greater than a thickness of the fourth portion;
   removing a portion of the passivation layer, a portion of the patterned semiconductor layer, and a portion of the patterned gate insulating layer by using the second half-tone patterned photoresist layer as a mask so as to form a plurality of semiconductor patterns disposed on the patterned gate insulating layer, the semiconductor patterns comprising a plurality of channel layers separated from one another;
   reducing a thickness of the second half-tone patterned photoresist layer until the fourth portion of the second half-tone patterned photoresist layer is removed to form a second patterned photoresist layer;
   forming a plurality of pixel electrodes on a region exposed by the second patterned photoresist layer, each of the pixel electrodes being electrically connected with one of the drains, respectively; and
   removing the second patterned photoresist layer.

20. The manufacturing method as claimed in claim 19, wherein a method of forming the dielectric patterns comprises performing an ink jet printing process.

21. The manufacturing method as claimed in claim 20, wherein a method of forming the dielectric patterns further comprises performing a curing process after the ink jet printing process is performed.

22. A manufacturing method of a thin film transistor array substrate, the manufacturing method comprising:
   forming a first patterned conductive layer on a substrate, the first patterned conductive layer comprising a plurality of scan lines, a plurality of gates connected with the scan lines, and a common line;
   sequentially forming an insulating material layer, a semiconductor material layer, and an ohmic contact material layer on the substrate to cover the first patterned conductive layer;
   forming a first half-tone patterned photoresist layer on the substrate, the first half-tone patterned photoresist layer having a first portion and a second portion, a thickness of the first portion being greater than a thickness of the second portion, the first half-tone patterned photoresist layer partially exposing a region above the common line;
   removing a portion of the ohmic contact material layer, a portion of the semiconductor material layer, and a portion of the insulating material layer by using the first half-tone patterned photoresist layer as a mask to form a patterned ohmic contact material layer patterned semiconductor layer, and a patterned gate insulating layer, wherein a plurality of first openings and a plurality of second opening are at least formed in the patterned gate insulating layer, and the second openings expose a portion of the common line;

reducing a thickness of the first half-tone patterned photoresist layer until the second portion of the first half-tone patterned photoresist layer is removed to form a first patterned photoresist layer;

forming a plurality of dielectric patterns in the first openings, a dielectric constant of the dielectric patterns being smaller than a dielectric constant of the patterned gate insulating layer;

forming a second patterned conductive layer on a region exposed by the first patterned photoresist layer, the second patterned conductive layer comprising a plurality of data lines, a plurality of sources connected with the data lines, and a plurality of drains;

removing the first patterned photoresist layer; removing a portion of the patterned ohmic contact material layer by using the second patterned conductive layer as a mask;

forming a passivation layer on the patterned semiconductor layer and the second patterned conductive layer;

forming a second half-tone patterned photoresist layer on the substrate, the second half-tone patterned photoresist layer having a third portion and a fourth portion, a thickness of the third portion being greater than a thickness of the fourth portion;

removing a portion of the passivation layer, a portion of the patterned semiconductor layer, and a portion of the patterned gate insulating layer by using the second half-tone patterned photoresist layer as a mask so as to form a plurality of semiconductor patterns disposed on the patterned gate insulating layer, the semiconductor patterns comprising a plurality of channel layers separated from one another;

reducing a thickness of the second half-tone patterned photoresist layer until the fourth portion of the second half-tone patterned photoresist layer is removed to form a second patterned photoresist layer;

forming a plurality of pixel electrodes on a region exposed by the second patterned photoresist layer, each of the pixel electrodes being electrically connected with corresponding one of the drains, respectively; and removing the second patterned photoresist layer.

23. The manufacturing method as claimed in claim 22, wherein a method of forming the dielectric patterns comprises performing an ink jet printing process.

24. The manufacturing method as claimed in claim 23, wherein a method of forming the dielectric patterns further comprises performing a curing process after the ink jet printing process is performed.

25. The manufacturing method as claimed in claim 22, wherein the common line has at least one shielding layer.

26. The manufacturing method as claimed in claim 25, wherein the at least one shielding layer is parallel to the data lines.

27. The manufacturing method as claimed in claim 26, wherein the at least one shielding layer is located below the data lines.

* * * * *